United States Patent [19]

Jeenicke et al.

[11] Patent Number: 4,461,979

[45] Date of Patent: Jul. 24, 1984

[54] LOW-DRIVE POWER SWITCHING TRANSISTOR CONTROL CIRCUIT

[75] Inventors: Edmund Jeenicke, Schwieberdingen; Immanuel Krauter, Erbstetten, both of Fed. Rep. of Germany

[73] Assignee: Robert Bosch GmbH, Stuttgart, Fed. Rep. of Germany

[21] Appl. No.: 379,634

[22] Filed: May 19, 1982

[30] Foreign Application Priority Data

May 23, 1981 [DE] Fed. Rep. of Germany ....... 3120695

[51] Int. Cl.³ ............................................. H05B 37/02

[52] U.S. Cl. ................................ 315/209 T; 307/300; 307/315; 315/200 R; 315/208

[58] Field of Search ............... 315/209 T, 200 R, 208; 307/300, 315

[56] References Cited

U.S. PATENT DOCUMENTS

| | | | |
|---|---|---|---|
| 2,949,543 | 8/1960 | Nordahl et al. | 307/315 |
| 3,210,561 | 10/1965 | Ullman | 307/315 |
| 3,841,288 | 10/1974 | Korteling | 315/209 T |
| 3,940,658 | 2/1976 | Allred | 315/209 T |
| 4,106,462 | 8/1978 | Hilldebrant et al. | 315/209 T |
| 4,164,747 | 8/1979 | Gerstner | 307/315 |
| 4,359,652 | 11/1982 | Jarrett et al. | 315/209 T |

FOREIGN PATENT DOCUMENTS 1901557 7/1969 Fed. Rep. of Germany .

*Primary Examiner*—Harold Dixon

*Attorney, Agent, or Firm*—Frishauf, Holtz, Goodman & Woodward

[57] ABSTRACT

A switching transistor (5) has its collector connected to a common junction (J) with a load (6), typically an ignition coil (8). A first driver transistor (11) connected through the base-emitter path of a second driver transistor (12) to control the conduction state of the switching transistor. A signal source (20, 21) alternatingly, causing the driver transistor to be blocked or conductive. To decrease the power requirements on the driver transistor, the driver transistor has its collector connected to the common junction (J) the voltage at line (13) of the driver and of the junction being arranged that the voltage at the junction (J) is less than the voltage at the base of the driver transistor when the switching transistor (5) is in fully saturated conductive condition, re-combination of charge carriers on the base of the switching transistor maintaining the switching transistor conductive until the charge carriers are exhausted, which causes a slight rise in voltage at the junction (J), but then causes increased conduction of the driver transistor due to the then overriding control from the driver transistor (11). The charge carriers, thereby, removing part of the load on the driver transistor. To insure rapid turn-off of the switching transistor (5), a control transistor (19) has its collector-emitter path connected across the base-emitter path of the switching transistor and, when rendered conductive, will cause the switching transistor to rapidly change to the blocked state.

4 Claims, 1 Drawing Figure

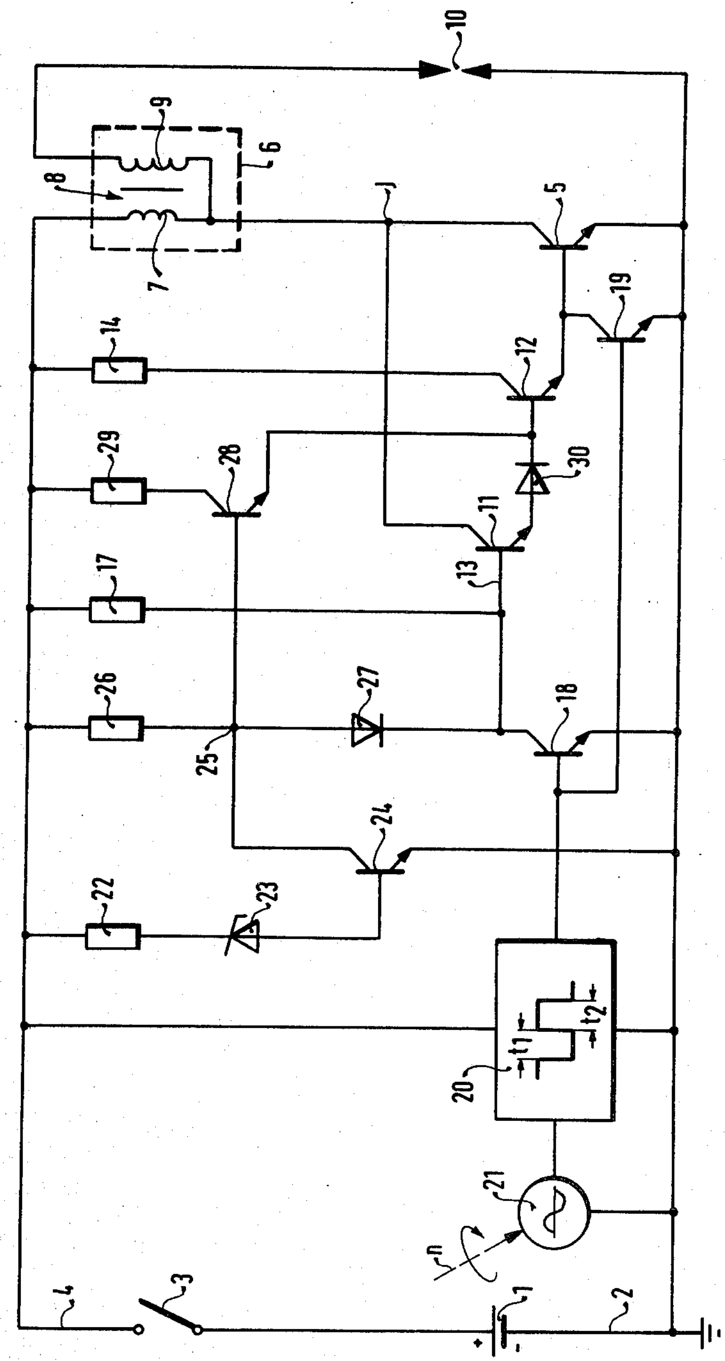
10
9
6
8
7
5
19
14
12
29
28
30
11
17
13
26
27
18
25
24
22
23
20
t1
t2
21
n
4
3
1
2

LOW-DRIVE POWER SWITCHING TRANSISTOR CONTROL CIRCUIT

The present invention relates to switching transistor circuitry, and more particularly to a switching transistor circuit which requires low drive power, and especially to a circuit of this type suitable for controlling control current flow to the primary of an automotive ignition coil and, then, suddenly interrupt current flow to generate an ignition spark pulse.

BACKGROUND

Switching transistors are frequently used in automotive control systems in which the emitter-collector path of a switching transistor is serially connected with the primary of an ignition coil. To store electromagnetic energy in the coil, the emitter-collector path is controlled to become conductive, thus permitting current to flow from a vehicle battery through the primary of the ignition coil. Upon control of the transistor to blocked or OFF condition, the current is interrupted abruptly causing, by transformer action, release of the stored electromagnetic energy to the secondary of the ignition coil and flash-over of a spark plug. The transistor has to be controlled to conduction or to blocked state by a driver circuit which, in turn, is controlled by a control signal source coupled to the crankshaft of the engine, directly or through a microprocessor, for example, so that current flow through the switching transistor is appropriately controlled, and the switching transistor is gated OFF at the proper instant of time for generation of a spark in accordance with a predetermined crankshaft position of the engine.

The ignition switching transistor, itself, is controlled to conduction or non-conduction by a control circuit which includes driver transistors for the switching transistor, see, for example, German Patent Disclosure Document DE-OS No. 19 01 557.

THE INVENTION

It is an object to improve switching control circuitry such that the driving power required for the switching transistor itself is reduced.

Briefly, the driver transistor and the switching transistor are so connected that the junction between the switching transistor and the load which is being switched, typically the primary of an ignition coil of an automotive engine, is connected to one of the main terminals, for example the collector, of the driver transistor. The driver transistor and the power transistor are so matched that the voltage at that junction is less than the voltage applied to the base of the driver transistor by its ignition control circuit. The driver transistor is connected through a coupling circuit, for example using a second driver transistor to the base of the main power switching transistor. The arrangement permits utilizing charge carriers in the base of the power transistor additionally to control the conduction thereof, thus reducing driving power required for the power transistor.

The system has the advantage that the driving power required for the driver transistor is reduced; this permits reduction in the power handling capacity of the driver transistor or transistors.

DRAWING

The single FIGURE is a schematic diagram of the circuit.

The invention will be explained in connection with an automotive ignition system in which the load to be switched is represented by the primary winding 7 of an ignition coil 8, the load being connected between a positive supply bus 4, and the negative or ground or chassis bus 2 to the switching path, that is, the collector-emitter terminals of a switching transistor 5. The ignition coil 8 which, generally, can be represented by a load 6, has its secondary 9 connected to a spark gap of a spark plug 10. Electrical power is supplied from a battery 1 which, typically, is the battery of an automotive vehicle, having an internal combustion engine (not shown) with which the ignition system is being used.

The battery 1 is connected to the negative or chassis bus 2 and to the positive bus 4 through a main or ignition switch 3. The power or switching transistor 5 is an npn transistor, the collector of which is connected to the load 6, and the emitter to the ground or chassis bus 2. Thus, the emitter-collector path of the switching transistor and the load 6 form a series circuit connected by buses 2, 4 to the power source 1. As is well known, the spark plug 10 is connected on one side to ground or chassis. The junction between the load 6 and the switching path, that is, the emitter-collector path of the transistor 5, is shown as junction J.

Conduction or blocked state of the transistor 5 is controlled by a driver circuit which includes the base-emitter path of a first npn driver transistor 11 and the base-emitter path of a second npn driver transistor 12, the second driver transistor also functioning as a coupling element. The emitter of the second driver transistor 12 is connected to the base of the switching transistor 5; the base of the first driver transistor 11 is connected to a terminal 13 forming a control line or terminal therefor. The collector of the second driver transistor 12 is connected through a collector resistor 14 to the positive bus 4. The emitter of the first driver transistor 11 is connected serially through a diode 30 to the base of the second driver transistor 12.

In accordance with a feature of the invention, the collector of the first driver transistor 11 is connected to the junction J, that is, to the junction between the collector of the main switching transistor 5 and the load 6. The transistors are so matched that, when the power or switching transistor 5 is in saturated conductive state, the voltage at junction J is less than the voltage applied to the base of the first driver transistor 11. The base connection to the driver transistor 11, formed by line 13, includes a base resistor 17 connected to the positive bus 4 and providing base current; and connected to the collector of a first npn control transistor 18, the emitter of which is connected to chassis bus 2. The base-emitter path of the switching transistor 5 is shunted by the collector-emitter path of a second control transistor 19, the base of which is connected to the base of the first control transistor 18. Transistors 19 and 5 are both NPN, namely the same conductivity type. The bases of the control transistors 18 and 19 are connected to the output of a pulse generator 20 which controls blocking or conduction of the switching transistor 5. The pulse generator 20 is so arranged that, during a pulse gap $t_1$, the switching transistor 5 is conductive; while the pulse persists, that is, during the pulse in the time $t_2$, the transistor 5 is controlled to blocked or non-conductive state. Control of the pulse generator 20 is obtained from a signal source 21, connected to ground or chassis with one terminal, which may, for example, be in form of a small a-c generator or an inductive pick-up connected, for example, to the crankshaft of the internal combustion engine, the ignition of which is to be controlled, as schematically indicated by the broken arrow n. The signal source 21 and the pulse source 20 do not form part of the present invention and may include substantially more complex circuitry.

A calibrating resistor 22 connected to positive bus 4 has its other terminal serially connected with the cathode of a Zener diode 23, the anode of which is connected to the base of an npn transistor 24. Transistor 24 has its emitter connected to chassis bus 2, and its collector to a junction 25 which is positioned between a resistor 26 connected to positive bus 4, and the anode of a diode 27, the cathode of which is connected to the collector of the control transistor 18. Diode 27 is a blocking diode. The junction 25, further, is connected to the base of an npn transistor 28, the emitter of which is connected to the base of the second driver transistor 12; the collector of transistor 28 is connected through a resistor 29 to positive bus 4. The base of the second driver transistor 12 thus is connected to the emitter of the first driver transistor 11 through the diode 30 and further to the emitter of the transistor 28. The anode of diode 30 is connected to the emitter of the first driver transistor 11.

OPERATION

Upon closing of switch 3, the system is ready to generate ignition pulses.

Let it be assumed that the signal source 21 controls the signal generator 20 to commence a pulse gap of time $t_1$. The emitter-collector path of the first control transistor 18 as well as the emitter-collector path of the second control transistor 19 will be controlled to blocking state. Consequently, control current will flow over the base-emitter path of the first driver transistor 11, the second driver transistor 12, and the switching transistor 5. Upon conduction of the switching transistor 5, the conductivity of the emitter-collector path increases, causing the voltage at the junction J to drop. The voltage relationship and the transistors are so arranged that when the power transistor 5 is conducting in saturated condition, that is, if the collector-emitter path is saturated, the voltage at junction J is less than the voltage on the base of the first driver transistor 11. As a result, current will flow from the base to the collector of the first driver transistor, reducing control current over the base-emitter path of the first driver transistor to the second driver transistor 12, and hence to the final power transistor 5. The emitter-collector path of the power transistor 5 is maintained in conductive state only by the accumulated charge carriers in the base-collector junction. This state will pertain only for so long until the charge carriers have been re-combined. Upon recombination, the voltage at the junction J will start to rise and will, eventually, exceed the voltage on the base of the driver transistor 11. At this point, control current will again flow over the emitter-collector path of the first driver transistor 11 to the second driver transistor 12 and then to the output transistor 5. The above-described cycle will then repeat.

It may occur that the supply voltage between buses 2 and 4 drops below ordinary or design level, for example upon starting of an internal combustion engine in which a starter motor is connected between the buses 2, 4. Saturation of the switching transistor 5 is insured by supplying additional control current through the emitter-collector path of transistor 28. Change-over of the emitter-collector path of the transistor 28 is obtained when the supply voltage drops below the threshold level of Zener diode 23, which controls transistor 24 to blocked state, permitting control current to flow to the transistor 28. Blocking diode 27 is provided to prevent rendering the current supply to the base of the first driver transistor 11 ineffective when the emitter-collector path of transistor 24 is conductive.

Upon change of state of the signal generator 20, that is, upon change to the pulse $t_2$, the emitter-collector path of the first control transistor 18, and the emitter-collector path of the second control transistor 19 will both become conductive, causing current supply to the base of the first driver transistor 11 to fail, so that the emitter-collector path of the first driver transistor 11 and hence of the second driver transistor 12 will become of high resistance, thus causing the switching transistor 5 to block. Transistor 19 will have its emitter-collector path conductive, however, to permit rapid removal of space charge on the base of the switching transistor 5 and instantaneous switch-over from conductive to blocked state. The rapid change in switching condition of the emitter-collector path of the switching transistor 5 causes a high voltage pulse to occur across the secondary 9 of the ignition coil 8. The emitter-collector path of the switching transistor 5, when completely changed over from conductive to blocking state, interrupts current flow through the primary winding 7 of ignition coil 8, and thus induces the high-voltage pulse in the secondary thereof to generate an effective spark at the spark gap of spark plug 10.

Various changes and modifications may be made within the scope of the inventive concept.

In an operative example, and arranged for a nominal battery voltage of 12 V, between buses 2, 4, transistor 5 was RCA 2N 3773 which resulted in the voltage at junction J, when in saturated, conductive state, of 0.5 V. Driver transistor 11 was BD 127, and the voltage applied to the base of the driver transistor during the time $t_1$ by the signal generator 20, from transistor 18, was 3 V. Resistor 17 was 510 Ω, and transistor 18 was BC 337. Transistor 12 was 2N 3055, and resistor 14 was 1 Ω. The d-c resistance of primary winding 7 was 0.5 Ω.

We claim:

1. Low-drive-power switching transistor control circuit having
   - an output switching transistor (5);
   - a connecting junction (J) serially connecting the emitter-collector path of the switching transistor (5) to a load (6);
   - a pair of supply terminals (2,4) supplying electrical power to the series circuit formed by the load (6), said junction (J) and the emitter-collector path of the switching transistor (5);
   - a first drive transistor (11);
   - means (13,17,18,20,21) connected to the base of the driver transistor (11) for controlling conduction of the driver transistor (11) and for supplying a control voltage thereto; and
   - a coupling circuit (12,14) connected from the output of the driver transistor (11) to the base of the switching transistor (5),
   - wherein, in accordance with the invention,
   - the emitter-collector path of the driver transistor (11) is connected to said junction between the load and the switching transistor (5);
   - a control transistor (19) of the same conductivity type as the switching transistor (5) is connected with its emitter-collector path in parallel with the base-emitter path of the switching transistor, said emitter-collector path being rendered conductive when the emitter-collector path of the switching transistor (5) enters the blocked state;

said coupling circuit includes a second driver transistor (12) having its emitter connected to the base of the switching transistor (5), its collector connected to a terminal of said load (6) remote from the switching transistor (5) and its base connected to the emitter of said said first driver transistor (11); and said driver transistor (11), the switching transistor (5) and the means for controlling the driver transistor (11) are so matched that the voltage at said junction (J) when the switching transistor (5) is in saturated conduction condition, is less than the control voltage applied to the driver transistor (11) to provide for maintaining the switching transistor (5) in the conductive state, for the period of time until the charge carriers at the base of the switching transistor (5) are recombined, independently of driving power supplied by said driver transistor, thus reducing loading on said driver transistor (11).

2. Circuit according to claim 1, further comprising means (28,29) for connecting the base of the second driver transistor (12) to a terminal of the load (6) remote from the switching transistor (5); and control means (23,24) for rendering said connecting means (28,29) conductive whenever the voltage between said supply terminals (2,4) falls below a predetermined value.

3. Circuit according to claim 1, wherein power dissipation and heat generation are minimized by saturating said switching transistor (5) whenever it is in the conductive state and by maintaining said saturation by means of space charge on its base as well as by control current over the base-emitter path of said driving transistor 11.

4. Internal combustion engine ignition system comprising the circuit of claim 1, wherein said load (6) comprises the primary winding of an ignition coil (8), and the means for controlling includes an ignition control system providing ignition control pulses separated by pulse gaps, respectively controlling the switched OFF state and conductive ON state of said switching transistor (5).

* * * * *